(12) United States Patent
Girdhar et al.

(10) Patent No.: US 8,884,367 B2
(45) Date of Patent: Nov. 11, 2014

(54) MOSGATED POWER SEMICONDUCTOR DEVICE WITH SOURCE FIELD ELECTRODE

(75) Inventors: Dev Alok Girdhar, Indialatic, FL (US); Timothy Donald Henson, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 983 days.

(21) Appl. No.: 12/243,253

(22) Filed: Oct. 1, 2008

(65) Prior Publication Data

US 2009/0096019 A1 Apr. 16, 2009

Related U.S. Application Data

(63) Continuation-in-part of application No. 12/028,101, filed on Feb. 8, 2008.

(60) Provisional application No. 60/900,222, filed on Feb. 8, 2007.

(51) Int. Cl.
*H01L 29/66* (2006.01)
*H01L 29/78* (2006.01)
*H01L 29/40* (2006.01)
*H01L 29/76* (2006.01)
*H01L 29/417* (2006.01)

(52) U.S. Cl.
CPC .......... *H01L 29/7813* (2013.01); *H01L 29/76* (2013.01); *H01L 29/407* (2013.01); *H01L 29/41766* (2013.01)
USPC ..................................................... 257/339

(58) Field of Classification Search
CPC ...................................................... H01L 29/76
USPC .................... 257/330, 331, 329, 327, 339
See application file for complete search history.

(56) References Cited

U.S. PATENT DOCUMENTS

| 5,384,269 | A | * | 1/1995 | Cho | 438/522 |
| 5,998,833 | A | | 12/1999 | Baliga | |
| 6,586,800 | B2 | | 7/2003 | Brown | |
| 6,649,975 | B2 | | 11/2003 | Baliga | |
| 6,710,403 | B2 | | 3/2004 | Sapp | |
| 7,741,675 | B2 | * | 6/2010 | Hirler | 257/330 |
| 2006/0033154 | A1 | | 2/2006 | Cao et al. | |

FOREIGN PATENT DOCUMENTS

EP 1 036 411 6/2006
JP 09298294 A * 11/1997

* cited by examiner

*Primary Examiner* — Ajay K Arora
(74) *Attorney, Agent, or Firm* — Farjami & Farjami LLP

(57) ABSTRACT

A power semiconductor device which includes a source field electrode, and at least one insulated gate electrode adjacent a respective side of the source field electrode, the source field electrode and the gate electrode being disposed in a common trench.

20 Claims, 3 Drawing Sheets

MOSGATED POWER SEMICONDUCTOR DEVICE WITH SOURCE FIELD ELECTRODE

RELATED APPLICATION

This application is a continuation-in-part of, claim priority to, and incorporates by reference the disclosure of U.S. patent application Ser. No. 12/028,101 entitled MOSFET DEVICE HAVING IMPROVED AVALANCHE CAPABILITY, filed Feb. 8, 2008, which is based on and claims the benefit of U.S. Provisional Application No. 60/900,222, filed on Feb. 8, 2007, entitled MOSFET DEVICE HAVING IMPROVED AVALANCHE CAPABILITY, to which a claim of priority is hereby made and the disclosure of which is incorporated by reference.

FIELD OF INVENTION

The present invention relates to power semiconductor devices and more particularly to MOSgated power semiconductor devices.

BACKGROUND OF THE INVENTION

The breakdown voltage and the operating resistance (On resistance or Rdson) are important characteristics of a power semiconductor device. The Rdson and the breakdown voltage of a power semiconductor device are inversely proportional. That is, the improvement in one adversely affects the other. To overcome this problem, U.S. Pat. No. 5,998,833 ('833 patent) proposes a trench type power semiconductor in which buried electrodes are disposed within the same trench as the gate electrodes in order to deplete the common conduction region under reverse voltage conditions, whereby the breakdown voltage of the device is improved. As a result, the resistivity of the common conduction region can be improved without an adverse affect on the breakdown voltage.

The buried electrodes shown in the '833 patent are electrically connected to the source contact of the device remotely, which may limit the switching speed of the device. Furthermore, the device shown therein may require at least one additional masking step.

U.S. Pat. No. 6,649,975 ('975 patent) and U.S. Pat. No. 6,710,403 ('403 patent) both show power semiconductor devices which include trenches that are deeper than the gate trenches to support field electrodes that are electrically connected to the source contact. The devices illustrated by the '975 patent and the '403 both require additional masking steps for defining trenches that receive field electrodes, which may increase the cost of production. In addition, the extra trenches increase the cell pitch and thus reduce cell density, which is undesirable.

U.S. patent application Ser. No. 11/110,467, assigned to the assignee of the present application, discloses a power MOSFET that includes an insulated source field electrode and two insulated gate electrodes in a common trench, in which a source contact makes electrical contact to the top surface of the source field electrode. As the cell pitch of such devices is reduced to obtain more current carrying capability per unit area, the width of the trenches and thus the width of the source field electrode decreases. As a result, the resistance of the source contact to the source field electrode increases.

It is, therefore, desirable to have an arrangement which may allow for the reduction of contact resistivity between the source contact and the source field electrode.

SUMMARY OF THE INVENTION

A MOSgated power semiconductor device according to the present invention includes at least one insulated gate electrode, and a source field electrode disposed within the same trench, the source field electrode being connected locally (i.e. within each unit cell) to the source contact of the device obtain faster switching speed.

A device according to the preferred embodiment of the present invention includes an active area having at least one active cell, the active cell including at least one source region, a source contact connected to the source region, a source field electrode electrically connected to the source contact and an insulated gate electrode adjacent one side of the source field electrode and a base region, the source field electrode extending to a depth below a depth of the insulated gate electrode and preferably a height above a height of the insulated gate electrode, wherein the source field electrode and the insulated gate electrode reside within a common trench.

According to one aspect of the present invention, at least a portion of a sidewall of the source field electrode adjacent the top end (the end that is farthest from the bottom of the trench) thereof is ohmically coupled to the source contact in order to reduce contact resistance between the source contact and the source field electrode.

In the preferred embodiment, a portion of the top end of the source field electrode is also ohmically coupled to the source contact of the device.

A device according to the present invention exhibits low Rdson, low breakdown voltage, very low Qgd, and very low Qgd/Qgs ratio.

Other features and advantages of the present invention will become apparent from the following description of the invention which refers to the accompanying drawings.

DETAILED DESCRIPTION OF THE FIGURES

Figure 1:
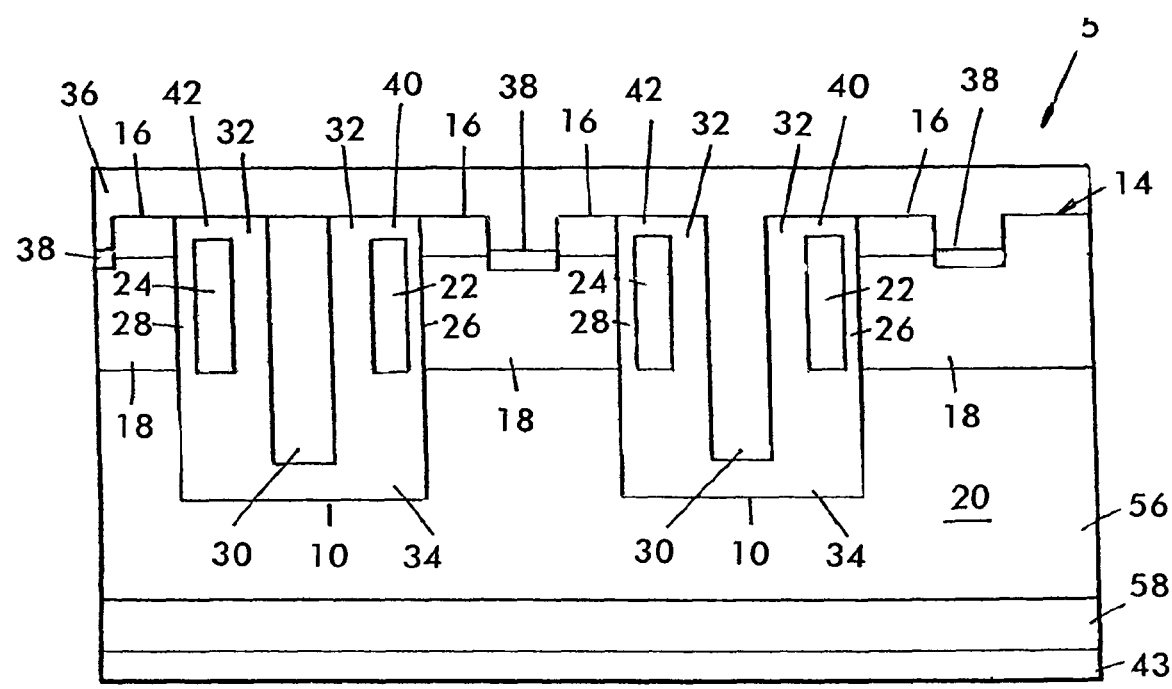
FIG. 1 schematically illustrates a cross-sectional view of the active region of a semiconductor device according to the prior art.

Referring to FIG. 1, a power semiconductor device 5 according to the prior art is a trench type MOSFET, which in the active area thereof includes trenches 10 in semiconductor body 56. Each trench 10 is preferably stripe shaped (but may be cellular) and extends from the top 14 of semiconductor body 56 along source regions 16, and through base region 18 into drift region 20.

A device 5 further includes in each trench 10 first insulated gate electrode 22 adjacent one sidewall of trench 10 and spanning base region 18, second insulated gate electrode 24 adjacent the opposing sidewall of trench 10 and spanning base region 18, first gate insulation 26 interposed between base region 18 and first gate electrode 22, second gate insulation 28 interposed between second gate electrode 24 and base region 18, and source field electrode 30 having a first portion disposed between first and second gate electrodes 22, 24 and a second portion disposed below first and second gate electrodes 22, 24. First gate electrode 22 and second gate electrode 24 are electrically connected to one another so that they may be activated together, but are insulated from source field electrode 30. Specifically, the first portion of source field electrode 30 is insulated from first and second gate electrodes 22, 24 by respective insulation bodies 32, and insulated from drift region 20 by bottom insulation body 34, which is thicker than first and second gate insulations 26, 28. Bottom insulation body 34 extends underneath first and second gate electrodes 22, 24.

Device 5 further includes source contact 36 which is electrically connected to source regions 16, source field electrode 30, and high conductivity contact regions 38 in base region 18. To insulate gate electrodes 22, 24 from source contact 36, first insulation cap 40 is interposed between source contact 36 and first gate electrode 22, and second insulation cap 42 is interposed between source contact 36 and second gate electrode 24. Thus, a device according to the present invention includes two insulated gate electrodes 22, 24, and a source field electrode 30 which is electrically connected at the top surface thereof to source contact 36, is disposed between the two insulated gate electrodes, and extends to a position below the gate electrodes.

Figure 2:
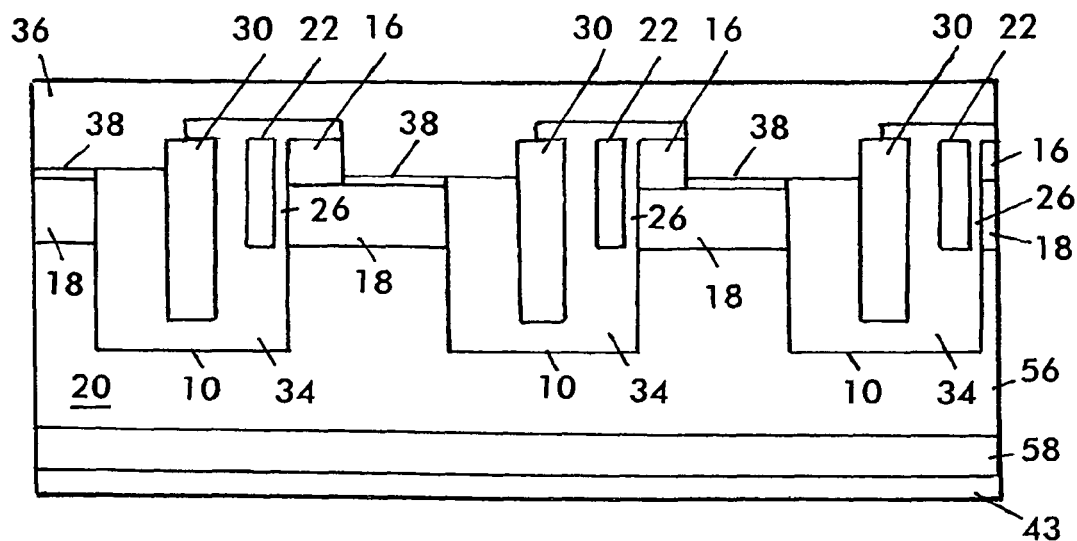
FIG. 2 illustrates a cross-sectional view of a power semiconductor device according to the first embodiment of the present invention.

Referring to FIG. 2, in which like numerals identify like features, a power semiconductor device according to the first embodiment is a power MOSFET that includes a source field electrode 30 disposed in each trench 10 thereof having a bottom surface closest to the bottom of trench 10, a top surface opposite the bottom surface and furthest from the bottom of trench 10, a first sidewall closest to first gate electrode 22, and a second sidewall opposite the first sidewall thereof.

According to one aspect of the present invention, at least a portion of the top surface and a portion of the second sidewall of source field electrode 30 adjacent the top portion thereof in each trench is exposed and source contact 36 makes ohmic contact to the portion of the top surface and the portion of the second sidewall that are exposed. As a result, source contact 36 is provided with more surface area for connection to source field electrode 30, whereby contact resistance between each source field electrode 30 and source contact 36 is reduced.

Figure 3:
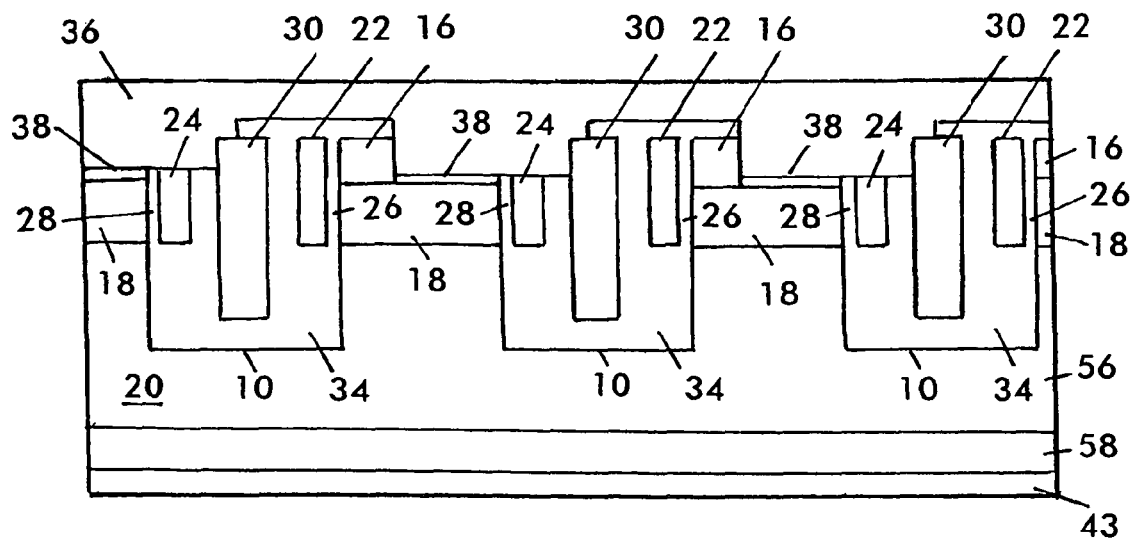
FIG. 3 illustrates a cross-sectional view of a power semiconductor device according to the second embodiment of the present invention.

Referring now to FIG. 3, in which like numerals identify like features, a device according to the second embodiment is a power MOSFET that includes all the features of the first embodiment, except that unlike the first embodiment, which does not include a second insulated gate electrode 24, a device according to the first embodiment includes at least a portion of an insulated second gate electrode 24, which is ohmically coupled to source contact 36 at the top surface thereof. An advantage of the embodiment disclosed in FIG. 3 over the one disclosed by FIG. 2 is its symmetry, so the source field electrode shape may be more controlled. Thus, adverse effects associated with voids in the polysilicon forming a gate electrode or a source field electrode may be lessened. In addition, during reverse blocking the source and gate are typically at the same potential, so the polysilicon body in the embodiment of FIG. 3 can act like the gate on the other side of the silicon mesa and may make breakdown more uniform.

Figure 4:
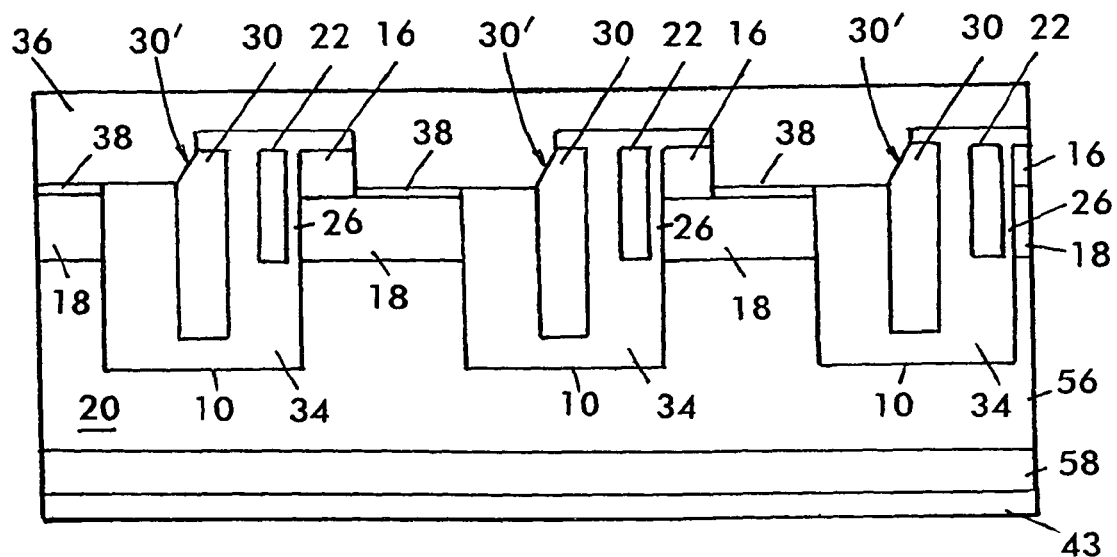
FIG. 4 illustrates a cross-sectional view of a power semiconductor device according to the third embodiment of the present invention.

Referring now to FIG. 4, in which like numerals identify like features, in a device according to the third embodiment, which is a variation of the first embodiment, the edge from the top portion of source field electrode may be removed, whereby a surface 30' extending from the top surface to a sidewall of source field electrode 30 is obtained. Such a surface may allow for better coverage by source contact 36. Note that surface 30' need not be flat but may have an irregular surface.

Figure 5:
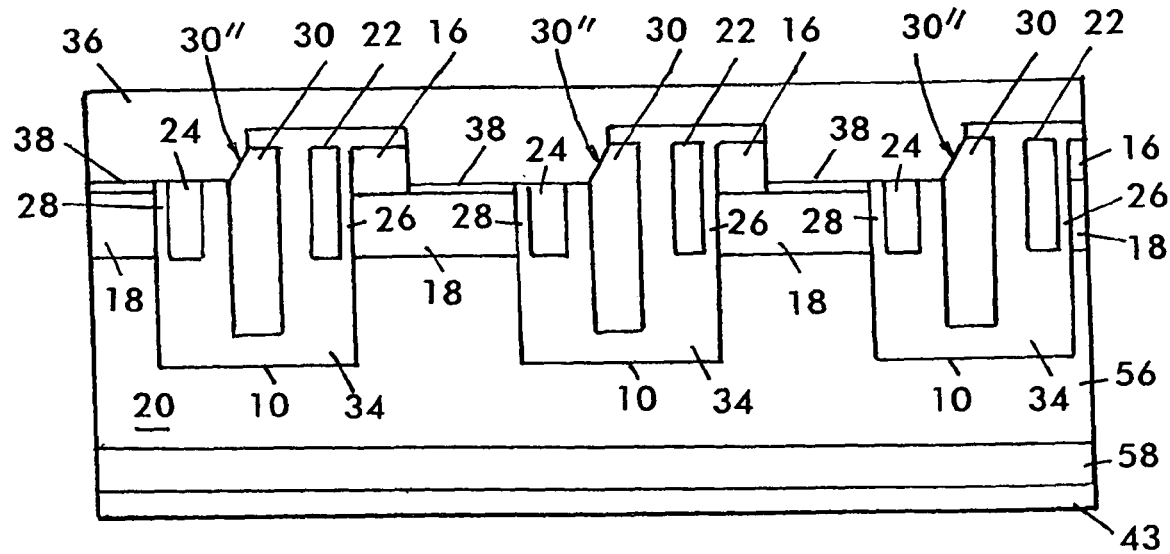
FIG. 5 illustrates a cross-sectional view of a power semiconductor device according to the fourth embodiment of the present invention.

Referring now to FIG. 5, in which like numerals identify like features, in a device according to the fourth embodiment, which is a variation of the second embodiment, a recess 30" may be provided atop source field electrode 30 whereby the edge from the top portion of source field electrode may be removed. As a result, better coverage by source contact 36 may be obtained.

Note that in each embodiment instead of having a narrow contact that may only touch a top surface of a source field electrode 30 a larger contact area is provided for the source metal 36. As a result, fabrication may be less complicated and source contact 36 can make better contact to source field electrode 30 as well as contact regions 38 of the device.

In each embodiment, semiconductor body 56 may be preferably comprised of silicon, which is epitaxially formed over a semiconductor substrate 58, such as a silicon substrate. Drain contact 43, which is in ohmic contact with substrate 58, makes vertical conduction between source contact 36 and drain contact 43 possible. As would be readily apparent to a skilled person, source regions 16 would be of the same conductivity type as drift region 20 and substrate 58, e.g. N-type, while base region 18 and high conductivity contact regions 38 are of another conductivity type, e.g. P-type. Note that contact regions 38 would be of higher conductivity (e.g. P+) than base region 18 (e.g. P−). Also, first and second gate electrodes 22, 24 and source field electrode 30 are composed of conductive polysilicon, and gate insulations 26, 28, insulation caps 40, 42, insulation bodies 32, and bottom insulation body 34 are composed of silicon dioxide.

Source contact 36, and drain contact 42 would be composed of any suitable metal such as aluminum or aluminum silicon.

The preferred embodiment shown herein is a power MOSFET. It should be noted that other power devices such as IGBTs, ACCUFETs and the like may be devised according to the principles disclosed herein without deviating from the scope and the spirit of the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
   a semiconductor body having a common conduction region of one conductivity type, and a base region of another conductivity type, said semiconductor body including a first surface;
   a trench extending from said first surface through said base region and into said common conduction region, said trench including at least two opposing sidewalls and a bottom;
   an insulated gate electrode including both a gate insulation adjacent one of said sidewalls and a gate electrode adjacent said gate insulation which spans said base region;
   a source field electrode inside said trench, said source field electrode including a first portion spanning said gate electrode and a second portion extending to a depth below said insulated gate electrode;
   a source region adjacent a sidewall of said trench and said base region; and
   a source contact ohmically coupled to said source region, wherein said source contact is in direct ohmic contact with at least a portion of a sidewall of said source field electrode that is parallel to said trench sidewalls.

2. A semiconductor device according to claim 1, wherein said source contact is ohmically coupled to a portion of a top surface of said source field electrode.

3. A semiconductor device according to claim 1, further comprising a bottom insulation body disposed between said second portion of said source field electrode and said sidewalls and said bottom of said trench.

4. A semiconductor device according to claim 3, wherein said bottom insulation body is thicker than said gate insulation.

5. A semiconductor device according to claim 3, wherein said bottom insulation body includes a first portion disposed below said gate electrode and a second portion opposite said first portion having a recess formed therein and another electrode formed in said recess ohmically coupled to said source contact.

6. A semiconductor device according to claim 1, wherein said source field electrode is comprised of conductive polysilicon.

7. A semiconductor device according to claim 1, wherein said gate electrode is comprised of conductive polysilicon.

8. A semiconductor device according to claim 1, wherein said semiconductor body is comprised of epitaxial silicon.

9. A semiconductor device according to claim 8, wherein said epitaxial silicon is formed over a silicon substrate, and further comprising a drain contact ohmically connected to said silicon substrate.

10. The semiconductor device of claim 1, further comprising a second insulated gate electrode including both a second gate insulation adjacent the opposite sidewall of said trench and a second gate electrode adjacent said second gate insulation which spans said base region.

11. A power semiconductor device comprising:
a semiconductor body including a top surface;
a trench extending from said top surface into said semiconductor body, wherein a gate electrode and a single source field electrode are disposed within said trench;
a gate insulation interposed between a sidewall of said trench and said gate electrode;
said source field electrode disposed between said gate electrode and an opposite sidewall of said trench, and said source field electrode extending below said gate electrode; and
a source contact coupled to said source field electrode at a portion of a sidewall of said source field electrode substantially parallel to said sidewall.

12. The semiconductor device of claim 11, wherein said source contact is ohmically coupled to a portion of a top surface of said source field electrode.

13. The semiconductor device of claim 11, further comprising a bottom insulation body disposed between the portion of said source field electrode extending below said gate electrode and said sidewalls and a bottom of said trench.

14. The semiconductor device of claim 13, wherein said bottom insulation body is thicker than said gate insulation.

15. The semiconductor device of claim 13, wherein said bottom insulation body includes a first portion disposed below said gate electrode and a second portion opposite said first portion having a recess formed therein and another gate electrode formed in said recess coupled to said source contact.

16. The semiconductor device of claim 11, wherein said source field electrode is comprised of conductive polysilicon.

17. The semiconductor device of claim 11, wherein said gate electrode is comprised of conductive polysilicon.

18. The semiconductor device of claim 11, wherein said semiconductor body comprises epitaxial silicon.

19. The semiconductor device of claim 18, wherein said epitaxial silicon is formed over a silicon substrate, and further comprising a drain contact ohmically connected to said silicon substrate.

20. The semiconductor device of claim 11, further comprising a second gate electrode disposed within said trench and a gate insulation interposed between said opposite sidewall and said second gate electrode.

* * * * *